(12) United States Patent
Li et al.

(10) Patent No.: US 9,006,352 B2
(45) Date of Patent: Apr. 14, 2015

(54) PHOTOSENSITIVE ALKALI-SOLUBLE RESIN, METHOD OF PREPARING THE SAME, AND COLOR PHOTOSENSITIVE RESIST CONTAINING THE SAME

(71) Applicant: BOE Technology Group Co., Ltd., Beijing (CN)

(72) Inventors: Lin Li, Beijing (CN); Shi Shu, Beijing (CN); Wenwen Sun, Beijing (CN); Ming Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/968,106

(22) Filed: Aug. 15, 2013

(65) Prior Publication Data
US 2014/0051814 A1 Feb. 20, 2014

(30) Foreign Application Priority Data
Aug. 16, 2012 (CN) .......................... 2012 1 0292588

(51) Int. Cl.
| | |
|---|---|
| C08F 222/08 | (2006.01) |
| C08F 8/00 | (2006.01) |
| C08F 8/06 | (2006.01) |
| C08F 212/08 | (2006.01) |
| C08F 220/28 | (2006.01) |
| G03F 7/004 | (2006.01) |
| G03F 7/027 | (2006.01) |
| G03F 7/00 | (2006.01) |
| C08G 81/02 | (2006.01) |
| C08F 222/06 | (2006.01) |
| C08G 65/32 | (2006.01) |
| G03F 7/033 | (2006.01) |

(52) U.S. Cl.
CPC ............ *G03F 7/0007* (2013.01); *C08G 81/025* (2013.01); *C08F 222/06* (2013.01); *C08G 65/32* (2013.01); *G03F 7/033* (2013.01)

(58) Field of Classification Search
CPC .... C08F 222/06; C08G 81/025; C08G 65/32; G03F 7/0007; G03F 7/033
USPC ....................................................... 525/471
See application file for complete search history.

(56) References Cited

U.S. PATENT DOCUMENTS

| | | | |
|---|---|---|---|
| 6,136,506 A | * 10/2000 | Hashimoto et al. ........ | 430/280.1 |
| 2010/0081089 A1 | 4/2010 | Kim et al. | |
| 2014/0051814 A1 | 2/2014 | Li et al. | |

FOREIGN PATENT DOCUMENTS

| | | |
|---|---|---|
| CN | 101059653 A | 10/2007 |
| CN | 101290473 A | 10/2008 |
| CN | 102786631 A | 11/2012 |

OTHER PUBLICATIONS

The State Intellectual Property Office of the People's Republic of China (Chinese Language) First Office Action for Application No. 201210292588.3 Issued on Oct. 29, 2013, five (5) pages.
The State Intellectual Property Office of the People's Republic of China English Translation of the First Office Action (listed above) for Application No. 201210292588.3 issued on Oct. 29, 2013, two (2) pages.
European Patent Office Communication of an Extended European Search Report, dated Nov. 13, 2013, three (3) pages.
Espacenet Bibliiographic Data, Abstract of CN101290473 (A), 1 page.
Espacenet Bibliiographic Data, Abstract of CN102786631 (A), 2 pages.
Notice of Preliminary Rejection (Korean language) issued by the Korean Intellectual Property Office ("KIPO") on Jan. 26, 2015 for International Application No. 10-2013-0096408, 5 pages.
English translation of Preliminary Rejection (listed above) issued by KIPO, 3 pages.

\* cited by examiner

*Primary Examiner* — Randy Gulakowski
*Assistant Examiner* — Christopher M Rodd

(57) ABSTRACT

Provided is a photosensitive alkali-soluble resin comprising a compound of formula (I), a method of preparing the same, and a color photosensitive resist containing the same, wherein $n_1$, $n_2$, $R_1$, $R_2$ and $R_3$ are defined as herein. The photosensitive alkali-soluble resin is prepared by: copolymerizing ethylene oxide with α-hydroxyalkyl phenyl ketone to obtain the first intermediate product, followed by copolymerizing the first intermediate product with a copolymerization product of glycerin acrylate, styrene, and maleic anhydride to obtain the second intermediate product, and oxidizing the second intermediate product to produce the photosensitive alkali-soluble resin.

Formula (I)

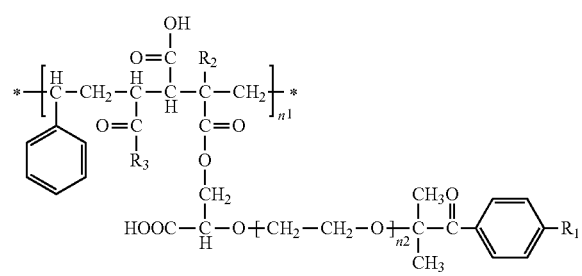

11 Claims, No Drawings

PHOTOSENSITIVE ALKALI-SOLUBLE RESIN, METHOD OF PREPARING THE SAME, AND COLOR PHOTOSENSITIVE RESIST CONTAINING THE SAME

CROSS REFERENCE TO RELATED APPLICATIONS

This application claims priority from Chinese National Application No. 201210292588.3 filed on Aug. 16, 2012, the contents of which are incorporated herein by reference.

FIELD OF INVENTION

The embodiments of the present invention relate to a photosensitive alkali-soluble resin, a method of preparing the same, and a color photosensitive resist containing the same.

BACKGROUND

With the continuing development of liquid crystal display, high definition and resolution have become the first choice of clients. In a liquid crystal display, color filter is an essential element for achieving a color display of the liquid crystal display. Thus, there is a continuous need for high quality color filters.

Color photosensitive resist is a material for producing color filters, and primarily composed of pigments, alkali-soluble resin, photo-curable resin, photo-initiators, solvent and adjuvants. Currently, pigment dispersion method is a predominant method for preparing color filters. This method is still utilized in low generation lines. However, when pigment dispersion method is utilized for producing liquid crystal displays having high definition and resolution, the difficulty of preparing color photosensitive resist increases due to the requirement of high resolution, high color gamut, and high color purity. For the purpose of obtaining a photosensitive resist having high color saturation, high color purity, and high color gamut, it is required to increase the percent of pigments in photosensitive resist. However, an increasing level of pigments affects the developing and sensitizing properties of the color photosensitive resist, thereby reducing the resolution.

Thus, there is a need for developing a novel photosensitive alkali-soluble resin having higher developing property, flexibility, and reactive activity to increase the resolution of liquid crystal display.

SUMMARY OF INVENTION

An embodiment of the present invention provides a photosensitive alkali-soluble resin comprising a compound of formula (I):

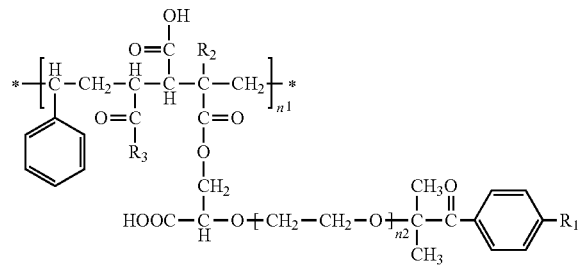

Formula (I)

wherein
n1 is an integer selected from the group consisting of 30 to 200;
n2 is an integer selected from the group consisting of 1 to 8;
$R_1$ is selected from the group consisting of —H, —O(CH$_2$)$_{n3}$OH, —O(CH$_2$)$_{n4}$OCOCH═CH$_2$, —N(CH$_3$)$_2$, —C$_n$H$_{2n+1}$ and —SCH$_3$;
n3 is an integer selected from the group consisting of 1 to 6;
n4 is an integer selected from the group consisting of 1 to 5;
n is an integer selected from the group consisting of 1 to 12;
$R_2$ is —H or —CH$_3$; and
$R_3$ is —H or —CH$_3$.

In one aspect, $R_1$ is selected from the group consisting of —H, —O(CH$_2$)$_2$OH, —O(CH$_2$)$_2$OCOCH═CH$_2$, —N(CH$_3$)$_2$, —C$_{12}$H$_{25}$ and —SCH$_3$.

Another embodiment of the present invention provides a method of preparing a photosensitive alkali-soluble resin comprising:
a) copolymerizing ethylene oxide with α-hydroxyalkyl phenyl ketone to obtain a first intermediate product;
b) copolymerizing the first intermediate product with a copolymerization product of glycerin acrylate, styrene and maleic anhydride to obtain the second intermediate product; and
c) oxidizing the second intermediate product to produce the photosensitive alkali-soluble resin.

In one aspect, the molar ratio of the ethylene oxide to the α-hydroxyalkyl phenyl ketone is 1:1-8:1; the molar ratio of the glycerin acrylate, the styrene and the maleic anhydride is (1-1.2):(1-1.2):(1-1.3); and the molar ratio of the ethylene oxide to the glycerin acrylate is (0.5-6.1):1.

In another aspect, 3-mercapto propionic acid is used in the copolymerization of the ethylene oxide and the α-hydroxyalkyl phenyl ketone with a molar ratio of the 3-mercapto propionic acid to the ethylene oxide of (0-0.1):1, and a mercapto-based chain transfer agent is used in the copolymerization of the glycerin acrylate, the styrene and the maleic anhydride with a molar ratio of the mercapto-based chain transfer agent to the glycerin acrylate of (0-0.4):1.

In still another aspect, the α-hydroxyalkyl phenyl ketone is 2-hydroxy-2-methyl-1-phenyl-1-propanone (hereinafter referred to as HMPP) or 2-hydroxy-2-methyl-1-(4'-hydroxyethyl)phenylpropanone (hereinafter referred to as HHMP).

In still another aspect, the step a) is carried out at a temperature of 70 to 120° C.; and the step b) is carried out at a temperature of 70 to 100° C.

In still another aspect, the copolymerization of both step a) and step b) is carried out in a solvent selected from the group consisting of di(propylene glycol) methyl ether acetate and ethyl 3-ethoxypropionate.

In still another aspect, the products obtained after the copolymerization of both step a) and step b) are settled in a solvent selected from the group consisting of petroleum ether, toluene or cyclohexane.

In still another aspect, the mercapto-based chain transfer agent is dodecyl thiol or mercapto ethanol.

Still another embodiment of the present invention provides a photosensitive resist comprising the above described photosensitive alkali-soluble resin.

DETAILED DESCRIPTION OF INVENTION

Hereinafter, the embodiments of the present invention are described in details with reference to examples. The examples are only for illustrating, other than limiting the embodiments of the present invention.

An embodiment of the present invention provides a photosensitive alkali-soluble resin comprising a compound of formula (I):

Formula (I)

$$\text{*}-\left[\begin{array}{c}H\\\overset{|}{C}-CH_2\\|\\\text{Ph}\end{array}\overset{\substack{OH\\|\\O=C-R_2\\|\\H-\overset{|}{C}-\overset{|}{C}-CH_2\\|\ \ \ \ H\\O=C\ \ \ \ C=O\\|\ \ \ \ \ \ \ \ \ |\\R_3\ \ \ \ \ \ \ O}}{}\right]_{n1}\text{*}$$

$$HOOC-\underset{H}{\overset{|}{C}}-O+CH_2-CH_2-O\underset{n2}{\overset{|}{+}}\underset{CH_3}{\overset{CH_3\ O}{\overset{|}{C}-\overset{\|}{C}}}-\text{Ph}-R_1$$

wherein
  n1 is an integer selected from the group consisting of 30 to 200;
  n2 is an integer selected from the group consisting of 1 to 8;
  $R_1$ selected from the group consisting of —H, —O$(CH_2)_{n3}$OH, —O$(CH_2)_{n4}$OCOCH=$CH_2$, —N$(CH_3)_2$, —$C_nH_{2n+}$, and —SCH$_3$;
  n3 is an integer selected from the group consisting of 1 to 6;
  n4 is an integer selected from the group consisting of 1 to 5;
  n is an integer selected from the group consisting of 1 to 12;
  $R_2$ is —H or —CH$_3$; and
  $R_3$ is —H or —CH$_3$.

In one aspect, $R_1$ is selected from the group consisting of —H, —O$(CH_2)_2$OH, —O$(CH_2)_2$OCOCH=$CH_2$, —N$(CH_3)_2$, —$C_{12}H_{25}$ and —SCH$_3$.

Another embodiment of the present invention provides a method of preparing a photosensitive alkali-soluble resin comprising:
a) copolymerizing ethylene oxide with α-hydroxyalkyl phenyl ketone to obtain a first intermediate product;
b) copolymerizing the first intermediate product with a copolymerization product of glycerin acrylate, styrene, and maleic anhydride to obtain a second intermediate product; and
c) oxidizing the second intermediate product to produce the photosensitive alkali-soluble resin.

In one aspect, a) may be carried out at a temperature of 70 to 120° C. so as to copolymerizing ethylene oxide with α-hydroxyalkyl phenyl ketone to obtain the first intermediate product.

An Example of the used α-hydroxyalkyl phenyl ketone may be HMPP or HHMP, such as, Darocure 1173 and Darocure 2959 manufactured by Ciba.

The copolymerization of ethylene oxide and α-hydroxyalkyl phenyl ketone may be carried out in a solvent selected from the group consisting of di(propylene glycol) methyl ether acetate and ethyl 3-ethoxypropionate.

The products obtained after the copolymerization of the ethylene oxide and the α-hydroxyalkyl phenyl ketone may be settled in a solvent selected from the group consisting of petroleum ether, toluene and cyclohexane.

In another aspect, b) may be carried out at a temperature of 70 to 100° C. so as to copolymerizing the first intermediate product with a copolymerization product of glycerin acrylate, styrene, and maleic anhydride to obtain the second intermediate product.

The copolymerization of glycerin acrylate, styrene and maleic anhydride copolymerization may be carried out in a solvent selected from the group consisting of di(propylene glycol) methyl ether acetate and ethyl 3-ethoxypropionate.

The products obtained after the copolymerization of glycerin acrylate, styrene, maleic anhydride may be settled in a solvent selected from the group consisting of petroleum ether, toluene and cyclohexane.

In yet another aspect, in c), the second intermediate product may be oxidized by adding $K_2FeO_4$, dimethyl sulfoxide or dicyclohexylcarbodiimide.

In yet another aspect, the molar ratio of the ethylene oxide to the α-hydroxyalkyl phenyl ketone may be 1:1-8:1; the molar ratio of glycerin acrylate, styrene and maleic anhydride may be (1-1.2):(1-1.2):(1-1.3); and the molar ratio of the epoxy resin to the glycerin acrylate may be (0.5-6.1):1.

In still another aspect, 3-mercapto propionic acid may be used in the copolymerization of ethylene oxide and α-hydroxyalkyl phenyl ketone with a molar ratio of 3-mercapto propionic acid to ethylene oxide of (0-0.1):1; and a mercapto-based chain transfer agent may be used in the copolymerization of glycerin acrylate, styrene and maleic anhydride with a molar ratio of mercapto-based chain transfer agent to glycerin acrylate of (0-0.4):1. An example of the used mercapto-based chain transfer agent may be dodecyl thiol or mercapto ethanol.

The still another embodiment of the present invention provides a color photosensitive resist comprising the aforesaid photosensitive alkali-soluble resin, pigments, a photo-curable resin, photo-initiators, solvent and adjuvants, etc. The photosensitive alkali-soluble resin may be any one as described hereinbefore, which is not described in details.

The photosensitive alkali-soluble according to an embodiment of the present invention comprises an alkoxy segment capable of improving the developing property of the alkali-soluble resin, and a long branched chain capable of increasing the flexibility of the alkali-soluble resin so as to distribute it in the components more uniformly. Meanwhile, the branched chain of the photosensitive alkali-soluble resin comprises a photosensitive group of —C(CH$_3$)$_2$COPhR$_1$ capable of improving a high reactive activity to the photosensitive alkali-soluble resin, thereby reducing the amount of micromolecular photo-initiators. Photosensitive resist prepared by using the photosensitive alkali-soluble resin according to the embodiments of the present invention can be used to produce color filters of liquid crystal display, and the formed patterns have relatively good developing property and relatively high resolution.

Hereinafter the procedure for preparing the photosensitive alkali-soluble resin will be illustrated with reference to the examples.

The first intermediate products and the second intermediate products obtained in the following examples represent similar structures, respectively. Various first intermediate products differ from each other in different substituent $R_1$, so do various second intermediate products. HMPP and HHMP are generally designated as α-hydroxyalkyl phenyl ketone. $R_1$ represents the substituent attached to the phenyl ring of the α-hydroxyalkyl phenyl ketone and may be —H or —O$(CH_2)_{n3}$OH or —N$(CH_3)_2$ or —$C_nH_{2n+1}$ or —O$(CH_2)_{n4}$OCOCH=$CH_2$ or —SCH$_3$; n3 represents an integer of 1 to 6; n4 represents an integer of 1 to 5; and n represents an integer of 1 to 12.

Example 1

Step a)

30 g (0.68 mol) of ethylene oxide, 20 g (0.12 mol) of HMPP (Darocure 1173, ciba), 3 g (0.028 mol) of 3-mercapto propionic acid, and 100 ml of di(propylene glycol) methyl ether acetate (PMA) (DOW Corporation) were mixed and charged into a three-neck flask. The mixture was heated to 100° C. in an oil bath. The reaction was stirred at a reflux temperature for 6 hours, and then stopped. The reaction mixture was then settled in petroleum ether to yield the first intermediate product as a dark brown solid. The resultant first intermediate product was dissolved in 80 ml of PMA to form a solution (0.6 mol/L).

Step b)

14 g (0.112 mol) of glycerin acrylate, 10 g (0.096 mol) of styrene, 12 g (0.122 mol) of maleic anhydride, 2.02 g (0.01 mol) of dodecyl thiol and 210 g of PMA were mixed in a four-neck flask, heated in an oil bath at 80° C., and subject to reflux condensation under stirring. When the temperature of the solution in the four-neck flask reached 85° C., an initiator of azodiisobutylnitrile (AIBN) solution (50% by mass) was added dropwise at a speed of 2 drops/second over 0.5 hours. After 3 hours of reaction, the first intermediate product-containing solution (0.6 mol/L) obtained in step a) was added dropwise over 0.5 hours. The reaction mixture was maintained at 85° C. in an oil bath, and stirred at reflux for 6 hours. After completion of the reaction, the reaction mixture was settled in toluene. The precipitate was dried to yield the second intermediate product as a solid.

Step c)

The second intermediate product obtained in step b) was dissolved in 100 g of ethyl 3-ethoxypropionate (EEP). Under stirring, 1.2 g of $K_2FeO_4$ oxidant was added at 30° C., and stirred for 6 hours. The reaction mixture was filtered to yield the photosensitive alkali-solution resin A1 as a pale yellow solid.

Example 2

Step a)

50 g (1.136 mol) of ethylene oxide, 26 g (0.152 mol) of HHMP (Darocure 2959), 5 g (0.047 mol) of 3-mercapto propionic acid and 150 ml of PMA were mixed and charged into a three-neck flask. The mixture was heat to 100° C. in an oil bath. After reflux under stirring for 6 hours, the reaction was stopped and settled in petroleum ether to yield the first intermediate product as a dark brown solid. The first intermediate product was dissolved in 150 ml of PMA to yield a solution (0.6 mol/L).

Step b)

30 g (0.24 mol) of glycerin acrylate, 25 g (0.24 mol) of styrene, 25 g (0.255 mol) of maleic anhydride, 2 g (0.01 mol) of dodecyl thiol and 210 g of PMA were mixed in a four-neck flask. The reaction mixture was heated in an oil bath at 80° C., and subject to reflux condensation under stirring. When the temperature of the solution in the four-neck flask reached 85° C., an initiator of azodiisobutylnitrile (AIBN) solution (50% by mass) was added dropwise at a speed of 2 drops/second over 0.5 hours. After 3 hours of reaction, the first intermediate product-containing solution (0.6 mol/L) obtained in step a) was added dropwise over 0.5 hours. The reaction mixture was maintained at 85° C. in an oil bath, and stirred at reflux for 6 hours. After completion of the reaction, the reaction mixture was settled in toluene. The precipitate was dried to yield the second intermediate product as a solid.

Step c)

The second intermediate product obtained in step b) was dissolved in 100 g of EEP. Under stirring, 1.2 g of $K_2FeO_4$ oxidant was added at 30° C., and stirred for 6 hours. The reaction mixture was filtered to yield the photosensitive alkali-solution resin A2 as a pale yellow solid.

Example 3

Step a)

4.4 g (0.1 mol) of ethylene oxide, 22.4 g (0.1 mol) of HHMP (Darocure 2959) and 100 ml of ethyl 3-ethoxypropionate (EEP) were mixed and charged into a three-neck flask. The mixture was heated to 70° C. in an oil bath. After reflux under stirring for 8 hours, the reaction was stopped and settled in toluene to yield the first intermediate product as a dark brown solid. The first intermediate product was dissolved in 80 ml of EEP to yield a solution (0.6 mol/L).

Step b)

25 g (0.2 mol) of glycerin acrylate, 23 g (0.221 mol) of styrene, 20 g (0.204 mol) of maleic anhydride, 0.156 g (0.002 mol) of mercapto ethanol and 200 g of EEP were mixed in a four-neck flask. The reaction mixture was heated in an oil bath at 70° C., and subject to reflux condensation under stirring. When the temperature of the solution in the four-neck flask reached 80° C., an initiator of azodiisobutylnitrile (AIBN) solution (50% by mass) was added dropwise at a speed of 2 drops/second over 0.5 hours. After 3 hours of reaction, the first intermediate product-containing solution (0.6 mol/L) obtained in step a) was added dropwise over 0.5 hours. The reaction mixture was maintained at 80° C. in an oil bath, and stirred at reflux for 8 hours. After completion of the reaction, the reaction mixture was settled in petroleum ether. The precipitate was dried to yield the second intermediate product as a solid.

Step c)

The second intermediate product obtained in step b) was dissolved in 100 g of PMA. Under stirring, 1.2 g of dimethyl sulfoxide oxidant was added at 30° C., and stirred for 6 hours. The reaction mixture was filtered to yield the photosensitive alkali-solution resin A3 as a pale yellow solid.

Example 4

Step a)

35.2 g (0.8 mol) of ethylene oxide, 16.4 g (0.1 mol) of HMPP, 8.48 g (0.08 mol) 3-mercapto propionic acid and 100 ml of PMA were mixed and charged into a three-neck flask. The mixture was heated to 120° C. in an oil bath. After reflux under stirring for 4 hours, the reaction was stopped and settled in cyclohexane to yield the first intermediate product as a dark brown solid. The first intermediate product was dissolved in 80 ml of PMA to yield a solution (0.6 mol/L).

Step b)

25 g (0.2 mol) of glycerin acrylate, 23 g (0.221 mol) of styrene, 20 g (0.204 mol) of maleic anhydride, 4.04 g (0.02 mol) of dodecyl thiol and 210 g PMA were mixed in a four-neck flask. The reaction mixture was heated in an oil bath at 100° C., and subject to reflux condensation under stirring. When the temperature of the solution in the four-neck flask reached 90° C., an initiator of AIBN solution (50% by mass) was added dropwise at a speed of 2 drops/second over 0.5 hours. After 3 hours of reaction, the first intermediate product-containing solution (0.6 mol/L) obtained in step a) was added dropwise over 0.5 hours. The reaction mixture was maintained at 90° C. in an oil bath, and stirred at reflux for 4 hours. After completion of the reaction, the reaction mixture was settled in toluene. The precipitate was dried to yield the second intermediate product as a solid.

Step c)

The second intermediate product obtained in step b) was dissolved in 100 g of EEP. Under stirring, 1.2 g of dicyclohexylcarbodiimide oxidant was added at 30° C., and stirred for 6 hours. The reaction mixture was filtered to yield the photosensitive alkali-solution resin A4 as a pale yellow solid.

Example 5

In accordance with the composition as recited in Table as below, the materials of each group were mixed and uniformly stirred to prepare the color photosensitive resists, which were designated to No. 1 to No. 5, respectively. The resultant color photosensitive resists were spin-coated onto glass substrates at 400 to 700 rpm with a spin-coater, to form films having a thickness of 1.5-2.0 μm. The films were pre-baked at 95° C. for 3 min, and exposed to UV light with a mask plate for 8 s, 12 s, 16 s, and 20 s, respectively. Then, the films were developed with a 0.05% potassium hydroxide solution to form pixel patterns.

Various materials as listed in Table 1 are commercially available from the following companies:

SB404: commercially available from Sartomer Inc.
DPHA: dipentaerythritol penta/hexa-acrylate, commercially available from Sartomer Inc.
Epoxy: DEN431, an epoxy phenolic resin, commercially available from DOW Corporation
IRGACURE® 369: commercially available from BASF
Leveling agent: glide440, a polysiloxane-polyether copolymer, commercially available from TEGO Inc.
Antifoam agent: Airex 920, commercially available from TEGO Inc.
EEP: ethyl 3-ethoxypropionate, commercially available from DOW Corporation
PMA: di(propylene glycol) methyl ether acetate, commercially available from DOW Corporation

TABLE 1

| No. | Alkali-Soluble Resin | Photo-Curable Monomers | | Pigment Dispersion | Initiators | | Solvent | | Adjuvants | |
|---|---|---|---|---|---|---|---|---|---|---|
| 1 | A1 12 g | DPHA 7 g | Epoxy 1 g | R-paste 90 g | IRGACURE® 369 0.7 g | EEP 20 g | Cyclohexanone 3 g | | Leveling agent 0.03 g | Antifoam agent 0.01 g |
| 2 | A2 12 g | DPHA 7 g | Epoxy 1 g | R-paste 90 g | IRGACURE® 369 0.7 g | EEP 20 g | Cyclohexanone 3 g | | Leveling agent 0.03 g | Antifoam agent 0.01 g |
| 3 | A3 12 g | DPHA 7g | Epoxy 1 g | R-paste 90 g | IRGACURE® 369 0.7 g | EEP 20 g | Cyclohexanone 3 g | | Leveling agent 0.03 g | Antifoam agent 0.01 g |
| 4 | A4 12 g | DPHA 7 g | Epoxy 1 g | R-paste 90 g | IRGACURE® 369 0.7 g | EEP 20 g | Cyclohexanone 3 g | | Leveling agent 0.03 g | Antifoam agent 0.01 g |
| 5 | SB404 8 g | DPHA 7 g | Epoxy 1 g | R-paste 90 g | IRGACURE® 369 2.0 g | EEP 17 g | Cyclohexanone 3 g | | Leveling agent 0.03 g | Antifoam agent 0.01 g |

Table 2 shows the comparison of characteristics of the pixel patterns developed at various exposure times of the color photosensitive resists Nos. 1 to 5 prepared in accordance with the composition as listed in Table 1.

In Table 2, the developed pixel patterns were observed under a microscope (200×) for the conditions of the patterns at various exposure times.

● represents clear and regular edges;
▲ represents slightly burred edges;
■ represents irregular edges; and
★ represents incomplete patterns.

Stability: The developed pixel patterns were placed under condition of 0 to 10° C., and recorded the changes vs. exposure times.

Pattern resolution: The patterns were exposed and developed with a mask plate having a line width of 20 μm, 15 μm, 12 μm, 8 μm, 6 μm, 3 μm, 2 μm, and 1 μm, respectively, and the width of the formed line having clear edges is considered as "resolution".

TABLE 2

| | Patterns | | | | Stability (Exposure Times) | | Resolution |
|---|---|---|---|---|---|---|---|
| No. | 8 s | 12 s | 16 s | 20 s | Immediately After Production | After 2 Weeks of Storage | |
| 1 | ● | ● | ▲ | ■ | 8 s | 8 s | 3 μm |
| 2 | ● | ● | ▲ | ■ | 8 s | 8 s | 3 μm |
| 3 | ● | ● | ▲ | ■ | 10 s | 10 s | 3 μm |
| 4 | ● | ● | ▲ | ■ | 10 s | 10 s | 3 μm |
| 5 | ★ | ■ | ■ | ● | 30 s | 30 s | 10 μm |

It can be seen from Table 2 that the photosensitive resists Nos. 1 to 4 (i.e., those produced by using the photosensitive alkali-soluble resin in accordance with the embodiments of the present invention) form lines having clear and regular edges at an exposure time of 8 s and 12 s; keep substantially unchanged after storage for 2 weeks under conditions of 0 to 10° C.; and can achieve a pattern resolution of up to 3 μm. In contrast, the photosensitive resist No. 5 (i.e., that produced by using the prior art photosensitive resin) form incomplete line patterns at an exposure time of 8 s and lines having irregular edges at an exposure time of 12 s; exhibit a substantive change after storage for 2 weeks under conditions of 0 to 10° C.; and achieve a pattern resolution of only 10 μm.

Thus, it can be seen that the color photosensitive resists produced by using the alkali-soluble resins of Examples 1 to 4 have high stability, high resolution, and good developing property.

The aforesaid description is merely to illustrate, instead of limit the present invention. Persons skilled in the art can understand that many modifications, variations, or equivalences can be made to the present invention without departing the spirit and scope as defined by the appended claims, which are encompassed by the present invention.

We claim:

1. A photosensitive alkali-soluble resin comprising a compound of formula (I):

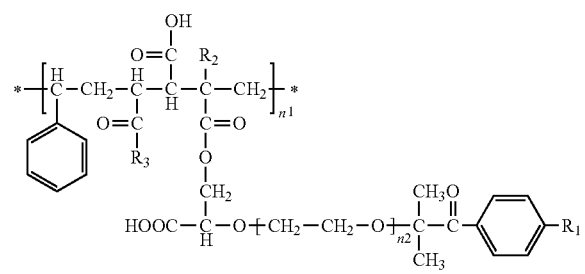

Formula (I)

wherein n1 is an integer selected from the group consisting of 30 to 200;

n2 is an integer selected from the group consisting of 1 to 8;

R1 selected from the group consisting of —H, —O(CH$_2$)$_{n3}$OH, —O(CH$_2$)$_{n4}$OCOCH=CH$_2$, —N(CH$_3$)$_2$, —C$_n$H$_{2n+1}$ and —SCH$_3$;

n3 is an integer selected from the group consisting of 1 to 6;

n4 is an integer selected from the group consisting of 1 to 5;

n is an integer selected from the group consisting of 1 to 12;

R2 is selected from the group consisting of —H and —CH$_3$; and

R3 is selected from the group consisting of —H and —CH$_3$.

2. The photosensitive alkali-soluble resin of claim 1, wherein

R1 is selected from the group consisting of —H, —O(CH$_2$) 2OH, —O(CH2)$_2$OCOCH=CH$_2$, —N(CH$_3$)$_2$, —C$_{12}$H$_{25}$ and —SCH$_3$.

3. A method of preparing a photosensitive alkali-soluble resin comprising:

a) copolymerizing ethylene oxide with α-hydroxyalkyl phenyl ketone to obtain a first intermediate product;

b) copolymerizing the first intermediate product with a copolymerization product of glycerin acrylate, styrene and maleic anhydride to obtain the second intermediate product; and c) oxidizing the second intermediate product to produce the photosensitive alkali-soluble resin, wherein the molar ratio of the ethylene oxide to the α-hydroxyalkyl phenyl ketone is 1:1 to 8:1; the molar ratio of the glycerin acrylate, the styrene and the maleic anhydride is (1-1.2):(1-1.2):(1-1.3); and molar ratio of the ethylene oxide to the glycerin acrylate is (0.5-6.1):1.

4. The method of claim 3, wherein 3-mercapto propionic acid is used in the copolymerization of the ethylene oxide and the α-hydroxyalkyl phenyl ketone with a molar ratio of 3-mercapto propionic acid to ethylene oxide of (0-0.1):1; and a mercapto-based chain transfer agent is used in the copolymerization of glycerin acrylate, styrene and maleic anhydride with a molar ratio of mercapto-based chain transfer agent to the glycerin acrylate of (0-0.4):1.

5. The method of claim 4, wherein the α-hydroxyalkyl phenyl ketone is selected from the group consisting of HMPP and HHMP.

6. The method of claim 4, wherein a) is carried out at a temperature of 70 to 120° C.; and b) is carried out at a temperature of 70 to 100° C.

7. The method of claim 4, wherein, in c), the oxidization is carried out by adding a material selected from the group consisting of K$_2$FeO$_4$, dimethyl sulfoxide and dicyclohexylcarbodiimide.

8. The method of claim 4, wherein the copolymerization of both a) and b) is carried out in a solvent selected from the group consisting of di(propylene glycol) methyl ether acetate and ethyl 3-ethoxypropionate.

9. The method of claim 4, wherein the products obtained after the copolymerization of both a) and b) are settled in a solvent selected from the group consisting of petroleum ether, toluene and cyclohexane.

10. The method of claim 4, wherein the mercapto-based chain transfer agent selected from the group consisting of dodecyl thiol and mercapto ethanol.

11. A color photosensitive resist comprising the photosensitive alkali-soluble resin of claim 1.

* * * * *